United States Patent
Cheung et al.

(10) Patent No.: US 10,699,932 B2
(45) Date of Patent: Jun. 30, 2020

(54) APPARATUS AND METHOD FOR INSPECTING SUBSTANTIALLY TRANSPARENT ELECTRONIC DEVICES

(71) Applicant: ASM Technology Singapore Pte Ltd, Singapore (SG)

(72) Inventors: Yu Sze Cheung, Hong Kong (HK); Man Yin Kwan, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/949,485

(22) Filed: Apr. 10, 2018

(65) Prior Publication Data

US 2019/0311931 A1   Oct. 10, 2019

(51) Int. Cl.
*H01L 21/68* (2006.01)
*G01N 21/95* (2006.01)
*H04N 5/225* (2006.01)

(52) U.S. Cl.
CPC ....... *H01L 21/681* (2013.01); *G01N 21/9501* (2013.01); *H04N 5/2256* (2013.01)

(58) Field of Classification Search
None
See application file for complete search history.

(56) References Cited

U.S. PATENT DOCUMENTS

| | | | | |
|---|---|---|---|---|
| 2004/0246421 A1* | 12/2004 | Inoue | ................ | G02F 1/133753 349/129 |
| 2009/0302343 A1* | 12/2009 | Sato | ...................... | F21S 41/147 257/98 |
| 2012/0057099 A1* | 3/2012 | Tanuma | ............... | G02B 6/0073 349/62 |
| 2017/0025349 A1* | 1/2017 | Wood | .................... | H01L 23/481 |
| 2017/0110477 A1* | 4/2017 | Han | .................... | G02F 1/13394 |

* cited by examiner

*Primary Examiner* — Talha M Nawaz
(74) *Attorney, Agent, or Firm* — Ostrolenk Faber LLP

(57) ABSTRACT

An apparatus and a method for inspecting a substantially transparent semiconductor device are provided, where the method comprises the steps of holding the substantially transparent semiconductor device with a semiconductor device holder, and illuminating a surface of the semiconductor device held by the semiconductor device holder from multiple directions with an enveloping light source. Thereafter, capturing a first image of the semiconductor device with an imaging module from the light projected from the enveloping light source, the first image revealing a direction of grinding marks on the said surface of the transparent semiconductor device. Then, relatively aligning the semiconductor device and an adjustable light source based on the direction of the grinding marks, and projecting light from the adjustable light source onto the surface of the semiconductor device at an oblique angle relative to the surface of the semiconductor device in a projection direction, such projection direction being substantially perpendicular to the direction of the grinding marks.

15 Claims, 8 Drawing Sheets

APPARATUS AND METHOD FOR INSPECTING SUBSTANTIALLY TRANSPARENT ELECTRONIC DEVICES

FIELD OF THE INVENTION

The present invention relates to an apparatus and method for inspecting electronic devices. More specifically, it relates to an apparatus and method for inspecting semiconductor devices comprising substrates that are substantially transparent.

BACKGROUND

FIGS. 1A-B respectively illustrate plan views of a functional surface 102 and a non-functional surface 104 on opposite sides of a singulated electronic device 100. The functional surface 102 comprises electrical contacts 106 of the electronic device 100, and the non-functional surface 104 comprises a laser marking 108 and an orientation mark 110. The laser marking 108 is provided for batch traceability and the prevention of lot mixing, and the orientation mark 110 is provided as an indicator to aid in orientating the electronic device during processing.

FIG. 2 shows an apparatus for inspecting the non-functional surface 104 of the electronic device 100. A light source 120 projects a light, which is reflected by a beam splitter 122 onto the non-functional surface 104 of the electronic device 100. The non-functional surface 104 reflects the light, which travels through the beam splitter 122 and is received by an imaging device 124. Thus, the imaging device 124 captures an image of the non-functional surface 104 of the electronic device 100.

If the electronic device 100 comprises a substrate which is opaque to the light that is projected onto the electronic device 100, a clear image 126 would be captured by the imaging device 124, as shown in FIG. 3A. The laser marking 108 and the orientation mark 110 absorbs, diffracts or disperses the light projected onto them, while the rest of the opaque substrate reflects the light. Thus, a clear image 126 is formed where a laser marking image portion 128 and an orientation mark image portion 130 are contrasted by a background image portion 132.

However, if the electronic device 100 comprises a substrate which is substantially transparent to the light that is projected onto the electronic device 100, an obscured image 134 is captured by the imaging device 124, as shown in FIG. 3B. This is because the incident light is transmitted through the transparent substrate of the electronic device 100 until the light is reflected by underlying circuitry 136 (see FIG. 2) in the electronic device 100. Hence, the laser marking image portion 128 and the orientation mark image portion 130 are obscured by a circuitry image portion 138. As depicted in the obscured image 134 in FIG. 3B, the underlying circuitry 136 obscures the laser marking 108 and the orientation mark 110, thus making inspection of the laser marking 108 and the orientation mark 110 difficult and inaccurate.

In order to address the aforesaid problem, a polymeric layer which is opaque to the projected light may be applied onto the non-functional surface 104 of the electronic device 100. In this way, the incident light is reflected by the polymeric layer 140 without passing through the transparent electronic device 100, allowing a clear image 126 depicting the laser marking image portion 128 and the orientation mark image portion 130 to be captured. Since the light is not transmitted through the transparent substrate, it does not reach the underlying circuitry 136, which obscures the inspection process. However, the polymeric layer adds to the thickness of the electronic device 100, and this additional thickness is unacceptable or undesirable for certain applications. The process of adding the polymeric layer may also introduce unnecessary complexity and impurities to the manufacturing process.

Hence, it would be beneficial to seek to provide a method of inspecting substantially transparent substrates which ameliorates at least some of the aforementioned problems of the prior art.

SUMMARY OF THE INVENTION

It is thus an object of this invention to seek to provide an apparatus and a method of inspecting substantially transparent substrates which improves a quality of an image of a surface of a substantially transparent electronic device captured by an imaging device as compared to the prior art.

According to a first aspect of the invention, there is provided a method for inspecting a substantially transparent semiconductor device, the method comprising the steps of: holding the substantially transparent semiconductor device with a semiconductor device holder; illuminating a surface of the semiconductor device held by the semiconductor device holder from multiple directions with an enveloping light source; capturing a first image of the semiconductor device with an imaging module from the light projected from the enveloping light source, the first image revealing a direction of grinding marks on the said surface of the transparent semiconductor device; relatively aligning the semiconductor device and an adjustable light source based on the direction of the grinding marks; and projecting light from the adjustable light source onto the surface of the semiconductor device at an oblique angle relative to the surface of the semiconductor device in a projection direction, such projection direction being substantially perpendicular to the direction of the grinding marks.

According to a second aspect of the invention, there is provided an apparatus for inspecting a substantially transparent semiconductor device, the apparatus comprising: a semiconductor device holder for holding the substantially transparent semiconductor device; an enveloping light source sized and configured to project light from multiple directions onto a surface of the semiconductor device; an imaging module positioned to receive the light projected from the enveloping light source to capture an image revealing a direction of grinding marks on the said surface of the semiconductor device; an adjustable light source positionable to project light onto the said surface of the semiconductor device at an oblique angle relative to the surface of the semiconductor device in a projection direction, such projection direction being substantially perpendicular to the direction of the grinding marks; and an alignment mechanism operative to align the adjustable light source relative to the semiconductor device based on the direction of the grinding marks.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENT OF THE INVENTION

Figure 1A:
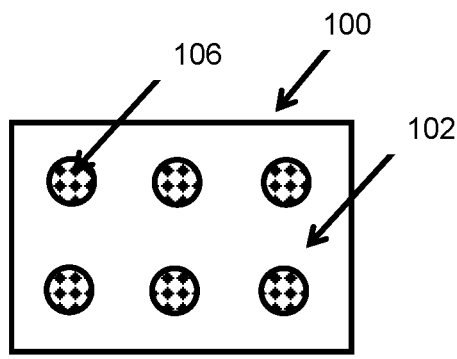
FIGS. 1A-B respectively illustrate plan views of a functional surface and a non-functional surface on opposite sides of a singulated electronic device.
Figure 1B:
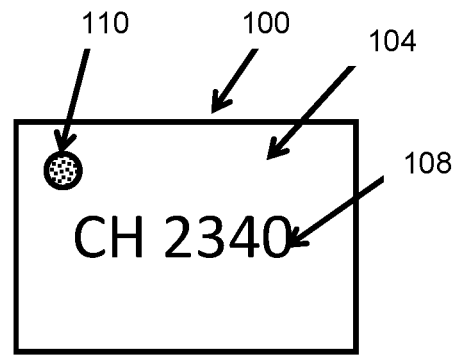
Figure 2:
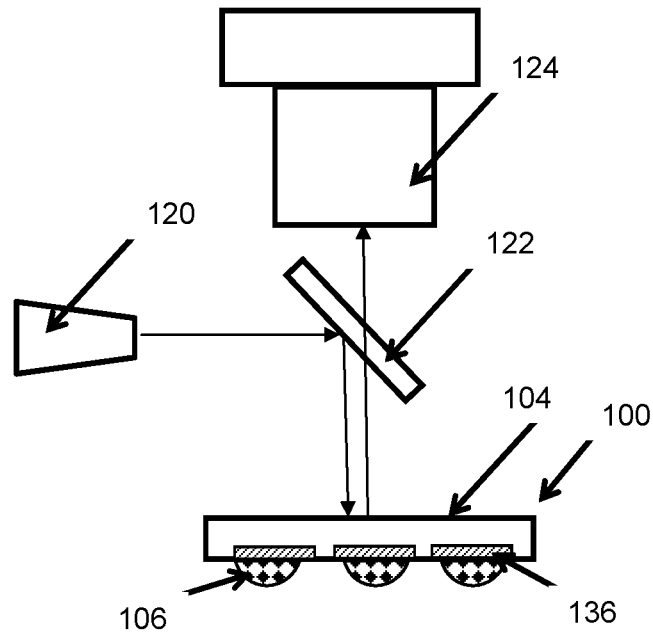
FIG. 2 shows an apparatus for inspecting the non-functional surface of the electronic device.
Figure 3A:
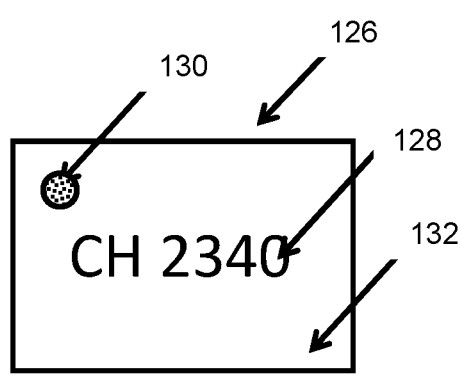
FIGS. 3A-B respectively show examples of a clear image and an obscured image captured by an imaging device in the apparatus of FIG. 2.
Figure 3B:
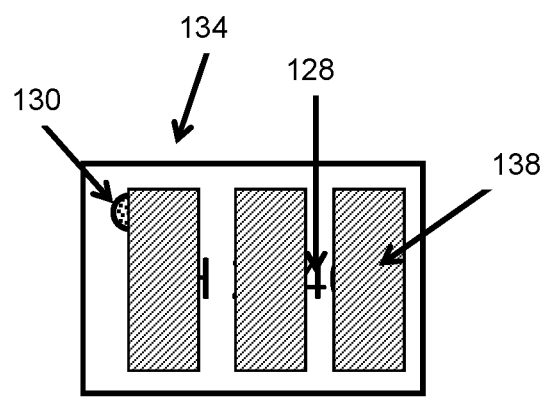
Figure 4:
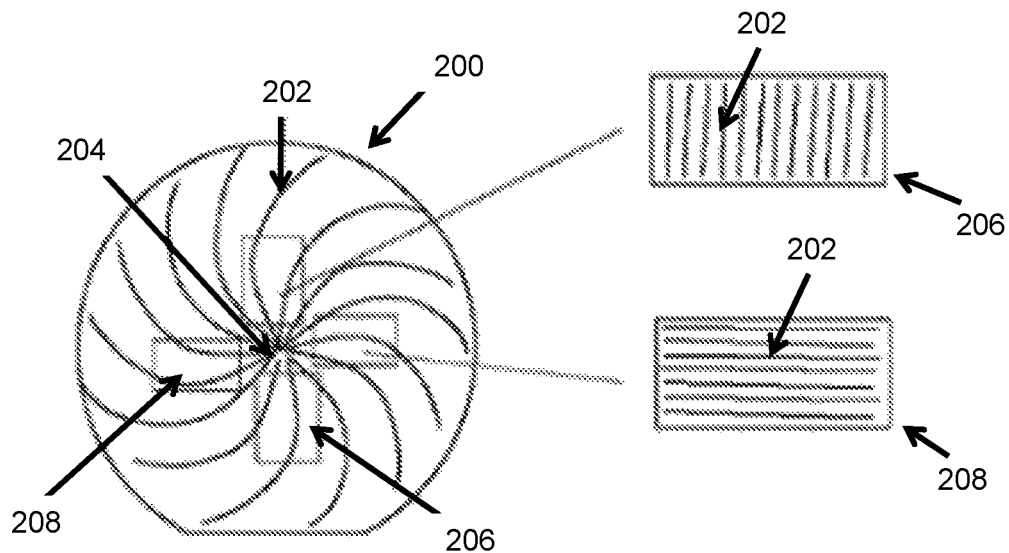
FIG. 4 shows a plan view of a non-functional surface of a wafer which has been grinded.

A back-side of a wafer 200 is usually grinded prior to singulation, in order to reduce a thickness of the wafer 200 after fabrication. The back-side grinding process typically produces curved grinding marks 202 on the surface of the grinded surface, where the curved grinding marks 202 extend radially from approximately a centre 204 of the wafer 200 towards a circumference of the wafer 200, as shown in FIG. 4. Although the grinding marks 202 are generally curved, it has been observed that the grinding marks 202 in relatively small localized portions 206, 208 of the wafer 200 appear to be substantially parallel, as illustrated in FIG. 4. In each localized portion 206, 208, the grinding marks 202 are substantially parallel, and typically deviate from one another by less than 10°. Hence, for a wafer 200 which is 8 inches in diameter, the grinding marks 202 in the localized portions 206, 208 with surface areas of about 2 mm$^2$ would appear to be substantially parallel. As such, singulated electronic devices 100 from a wafer 200 that are substantially smaller than the wafer 200 would have grinding marks 202 on the grinded surface (i.e. on the non-functional surface 104) that typically appear to be substantially parallel.

Figure 5:
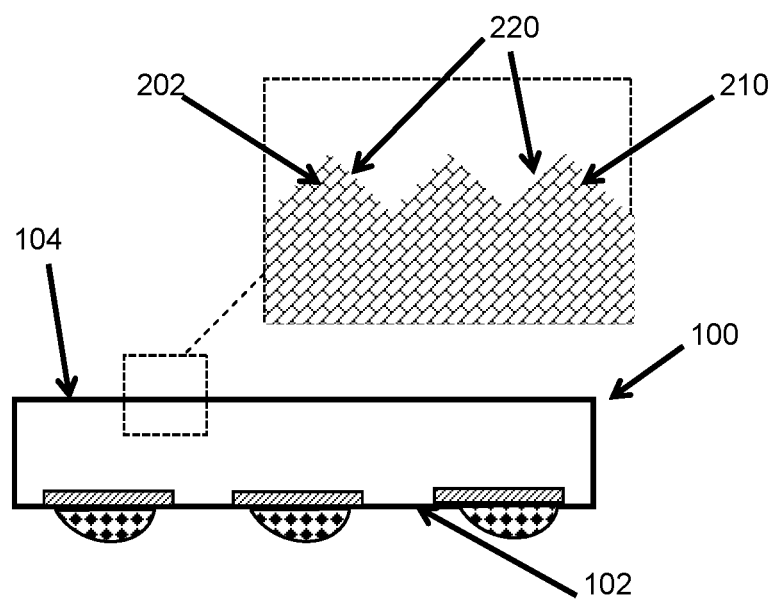
FIG. 5 shows cross-sectional views of an electronic device and of a magnified portion of the non-functional surface of the electronic device.

FIG. 5 shows cross-sectional views of an electronic device 100 and of a magnified portion of the non-functional surface 104 of the electronic device 100. When sufficiently magnified, it can be observed that the grinding marks 202 on the non-functional surface 104 actually form small ridge structures 210 and appear to be microscopically corrugated.

Examples of substrate materials which are substantially transparent or translucent to visible light include Lithium Niobate or Silicon Nitride. Such substantially transparent substrates would normally only reflect a small proportion of the incident light, a majority of the incident light being transmitted through the substrate material. However, the inventors of the present invention have found that if the incident light arrives at the non-functional surface 104 of such substantially transparent substrates at angles that are transverse to the direction of the ridge structures 210, a substantially greater proportion of the incident light is reflected than at other angles. This is because the small ridge structures 210 comprise small sloping surfaces 220 which are operative to enhance the reflection of light that is projected onto the sloping surfaces 220.

Figure 6:
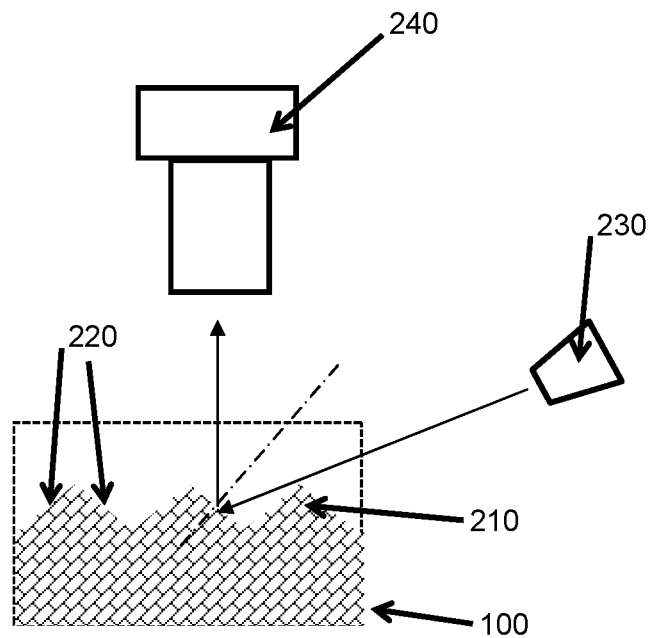
FIG. 6 illustrates small sloping surfaces of small ridge structures reflecting light from a light source.
Figure 7:
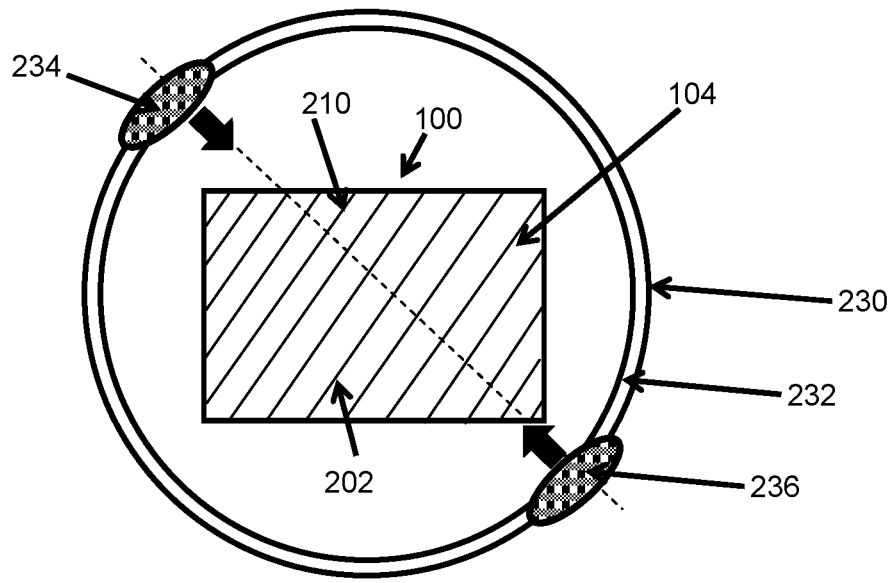
FIG. 7 shows a plan view of the light source illuminating the non-functional surface of the electronic device.

FIG. 6 illustrates the small sloping surfaces 220 of the small ridge structures 210 reflecting light from an adjustable light source 230, and FIG. 7 is a plan view of the adjustable light source 230 illuminating the non-functional surface 104 of the electronic device 100. The adjustable light source 230 comprises two LEDs 234, 236 mounted on two ends of a diameter of a ring structure 232. The LEDs 234, 236 are in turn arranged to project light rays onto the sloping surfaces 220. In one embodiment, the two LEDs 234, 236 are mounted on two opposite points on the ring structure 232. However, the ring structure 232 may be of other shapes, such as square, rectangular, or ellipsoidal shapes. In these cases, the two LEDs 234, 236 would be mounted on two opposite sides of the square, rectangular, or ellipsoidal ring structure 232.

As shown in FIG. 6, the adjustable light source 230 is arranged at a certain distance above the small ridge structures 210, so the two LEDs 234, 236 project light onto the non-functional surface 104 at oblique angles to the non-functional surface 104 of the electronic device 100. Such oblique angles are greater than 0° and less than 90°. Furthermore, as shown in FIG. 7, the light source 230 is also positioned outside a perimeter of the electronic device 100 such that the light is projected onto the small ridge structures 210 at a projection direction which is at a substantially perpendicular angle to the substantially parallel small ridge structures 210 or grinding marks 202. In other words, the adjustable light source 230 projects light along planar directions which are substantially perpendicular to the direction of the grinding marks 202 on the electronic device 100. For example, the projection direction may be arranged at between 80° and 100° with respect to the grinding marks 202. The light may thus arrive at the small ridge structures 210 along a plane which is substantially perpendicular to the small sloping surfaces 220, where the plane is substantially perpendicular if it deviates from the perpendicular by less than 10°.

Figure 8:
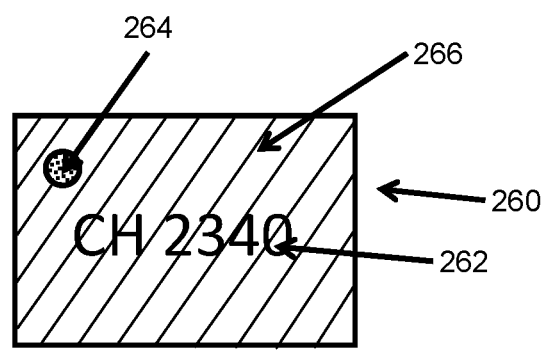
FIG. 8 shows a clear image of the non-functional surface of the electronic device, which includes a laser marking image portion, an orientation mark image portion and a grinding mark image portion.

When the incident light is projected onto the non-functional surface 104 of the electronic device 100 at an oblique angle and substantially perpendicular to the substantially parallel small ridge structures 210 or grinding marks 202, the incident light is reflected by the small sloping surfaces 220. A camera 240 is positioned to receive the light reflected by the small sloping surfaces 220, thus allowing the camera 240 to capture a clear image 260 of the non-functional surface 104 of the electronic device 100. FIG. 8 shows a clear image 260 of the non-functional surface 104 of the electronic device 100, which includes a laser marking image portion 262, an orientation mark image portion 264 and a grinding mark image portion 266. Thus, a laser marking 108 and an orientation mark 110 on the non-functional surface 104 of the electronic device 100 are clearly distinguishable from the clear image 260.

Figure 9:
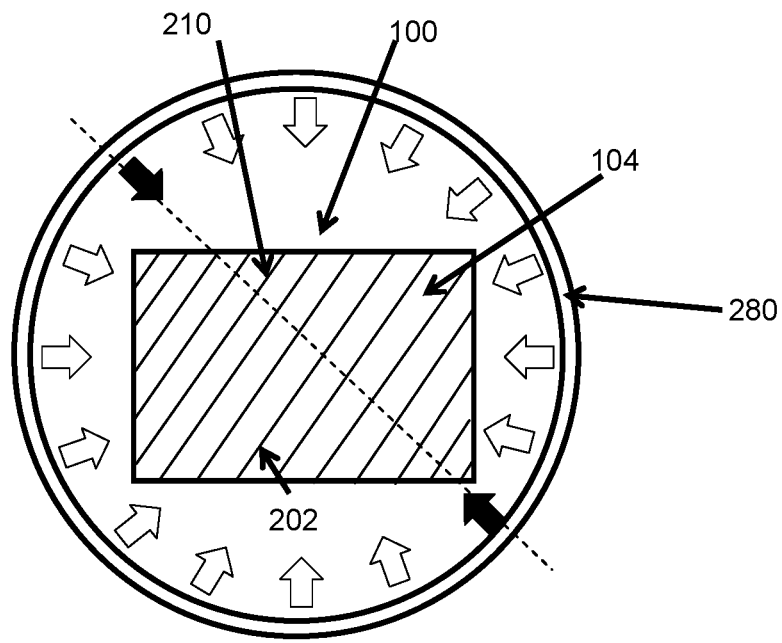
FIG. 9 shows a plan view of an enveloping light source illuminating the non-functional surface of the electronic device.
Figure 10:
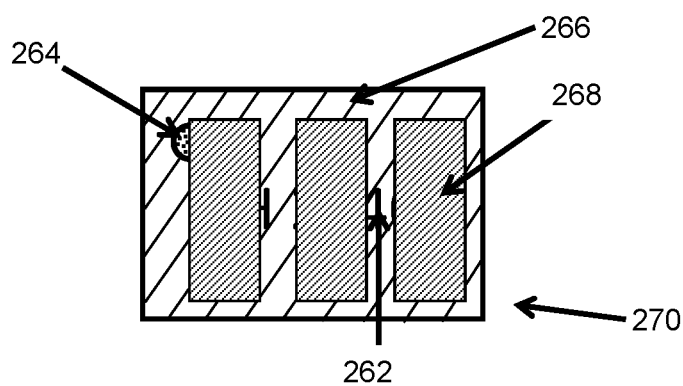
FIG. 10 is a plan view of an obscured image of the non-functional surface of the electronic device, which includes a laser marking image portion, an orientation mark image portion, a grinding mark image portion and a circuitry image portion.

On the other hand, if an enveloping light source 280, such as a ring light source, is used instead to project light onto the non-functional surface 104 of the electronic device 100, as shown in FIG. 9, an obscured image 270 as shown in FIG. 10 would be captured by the camera 240 (see FIG. 6). In addition to the laser marking image portion 262, the orientation mark image portion 264 and the grinding mark image portion 266, the obscured image 270 further includes a circuitry image portion 268 which obscures the other image portions 262, 264, 266. This is because the enveloping light source 280 projects light from multiple directions, and some of the light may arrive at the non-functional surface 104 in directions that are not substantially perpendicular to the small ridge structures 210 or grinding marks 202. Such non-perpendicular light is transmitted through the transparent substrate material such that the light is reflected by underlying circuitry 136 in the electronic device 100 towards the imaging device 124.

Nevertheless, it is not necessary for the small ridge structures 210 to reflect all of the light incident on the non-functional surface 104. Enough light should be reflected by the small ridge structures 210 to allow a sufficiently clear image to be captured. The actual range of the incident light angles that is suitable for any particular inspection process depends on various factors such as the light source used, the substrate material being inspected, the shape and size of the small ridge structures 210, and the amount of light that needs to be reflected for a sufficiently clear image to be captured. The suitable range of angles may be determined through calibration.

Figure 11:
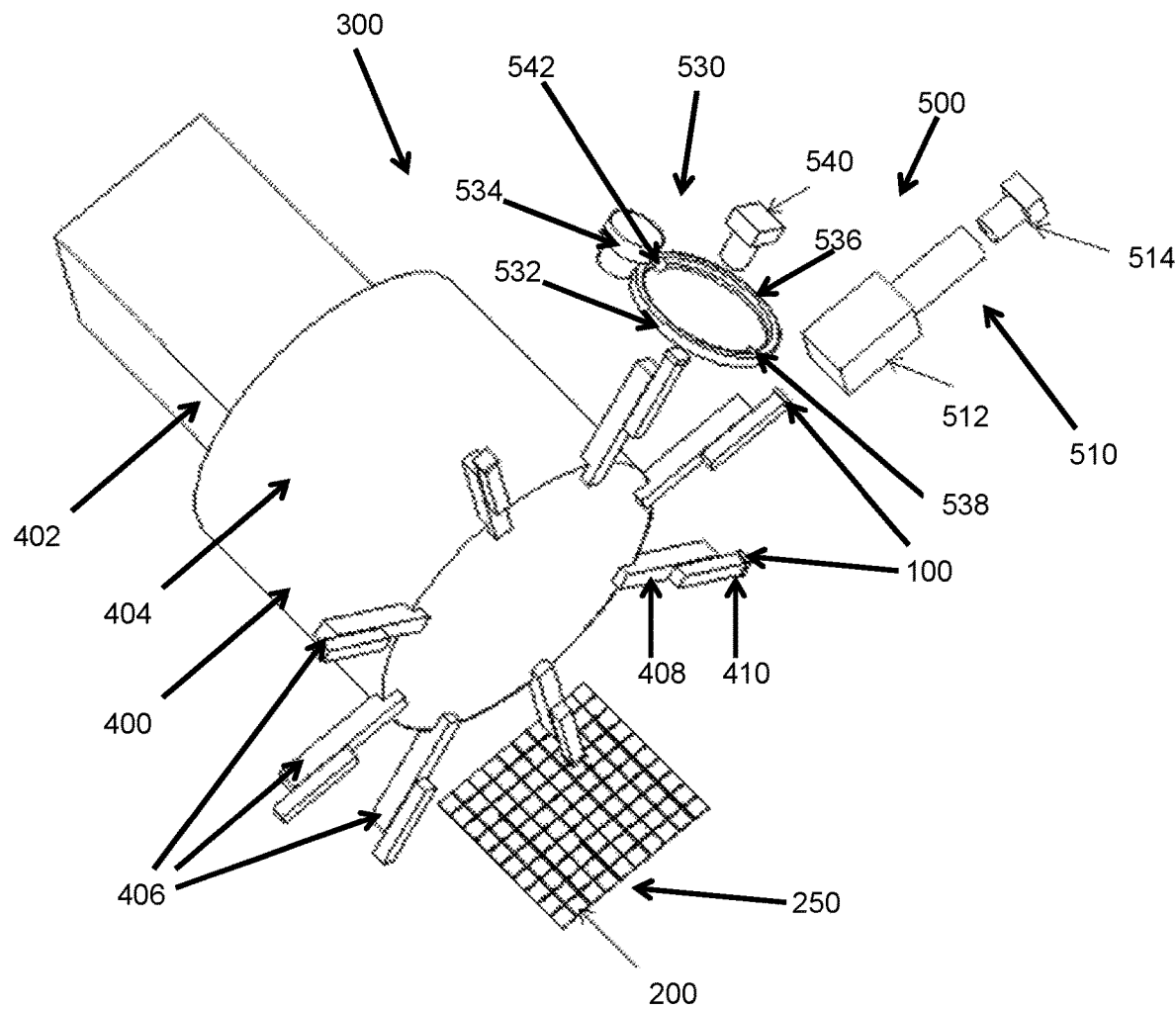
FIG. 11 illustrates a perspective view from the top of an inspection apparatus according to the preferred embodiment of the present invention.
Figure 12:
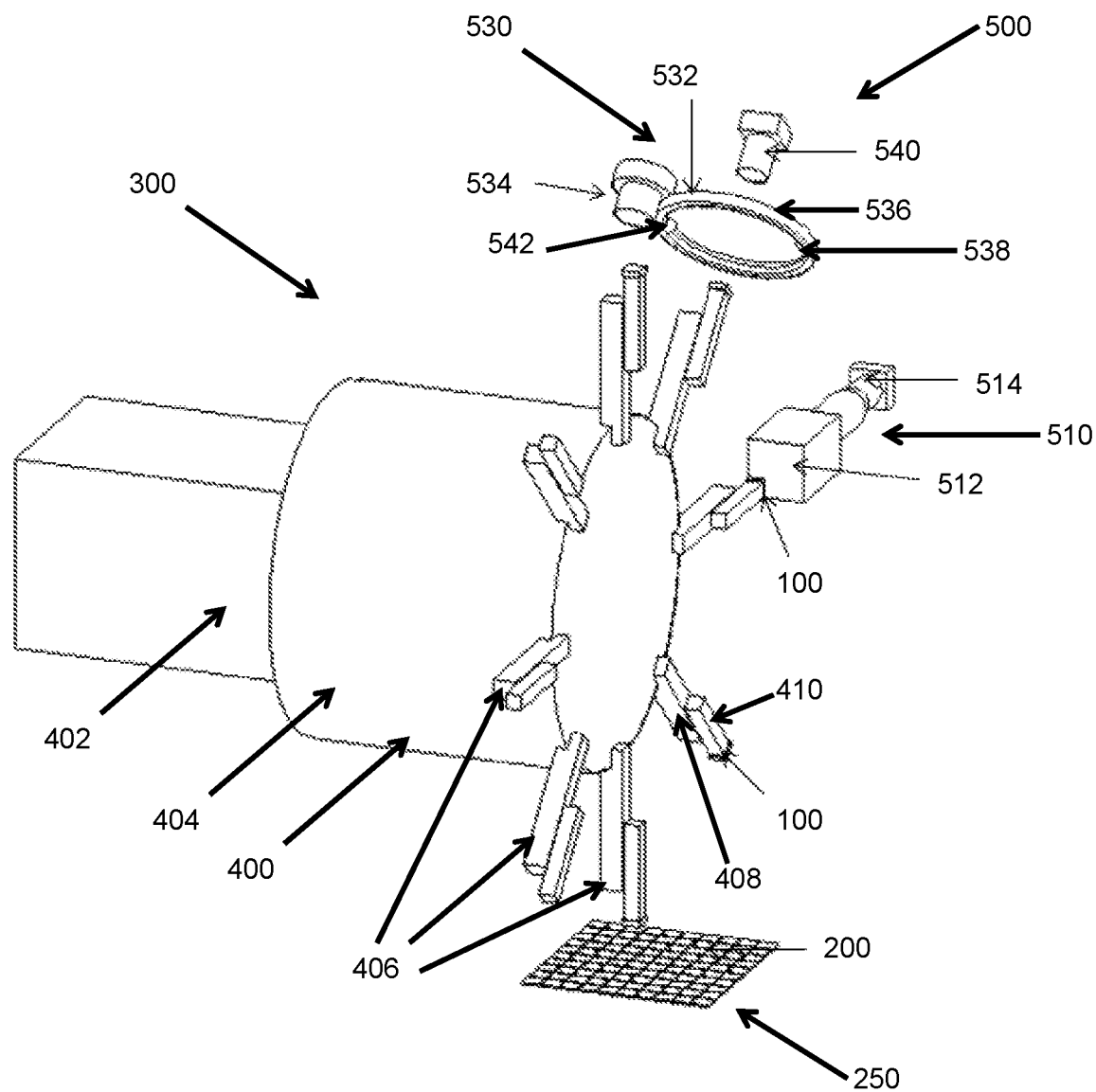
FIG. 12 illustrates a perspective view of the inspection apparatus of FIG. 11 from a side view angle.

FIG. 11 is a perspective view from the top of an inspection apparatus 300 according to the preferred embodiment of the present invention, and FIG. 12 is a perspective view of the inspection apparatus 300 of FIG. 11 from a side view angle.

The inspection apparatus 300 comprises a flipper 400 and an inspection module 500. The flipper 400 picks up electronic devices 100 from a wafer 200 located at a holding area 250, and transfers the electronic devices 100 to the inspection module 500 for inspection.

The flipper 400 comprises a motor 402 for rotating a turret body 404 about a horizontal axis. The turret body 404 comprises a plurality of holders 406 arranged to be spaced apart from one another around a circumference of the turret body 404. The turret body 404 comprises 8 holders 406, wherein a respective holder 406 may be positioned at each of 0°, 45°, 90°, 135°, 180°, 225°, 270° and 315° positions around the circumference of the turret body 404. The turret body 404 may also have more than or less than 8 holders 406, and the holders 406 may be positioned at other positions around the circumference of the turret body 404 according to design. Each holder 406 comprises a respective longitudinal arm 408 extending radially outwards from the circumference of the turret body 404. Each holder 406 also comprises a respective pick head 410 located at a remote end of each longitudinal arm 408. The pick heads 410 are operable for picking up electronic devices 100 by, for example, suction force or mechanical gripping.

The turret body 404 is operable to rotate about the horizontal axis to position the plurality of holders 406 at 8 indexing positions. Hence, the 8 indexing positions are generally located at the 0°, 45°, 90°, 135°, 180°, 225°, 270° and 315° positions around the circumference of the turret body 404. There may be more than or less than 8 indexing positions, and the indexing positions may be positioned at other positions around the circumference of the turret body 404. However, the number of indexing positions would normally correspond to the number of holders 406 arranged around the turret body 404, such that the holders 406 are indexed to the next indexing position each time the turret body 404 rotates and stops.

The inspection module 500 comprises a full lighting module 510 and an adjustable lighting module 530. If the wafer 200 is located at the 180° position, the full lighting module 510 may be located at the 90° position and the adjustable lighting module 530 may be located at the 45° position with respect to the circumference of the turret body 404. The full lighting module 510, the adjustable lighting module 530 and the wafer 200 may also be positioned at other angles around the circumference of the turret body 404 as desired.

The full lighting module 510 comprises an enveloping light source 512, such as a ring light source or a plurality of LEDs arranged in a circle. The enveloping light source 512 is not limited to being round, and may be of any shape including elliptical, triangular, square, rectangular or polygonal. The full lighting module 510 further comprises a full lighting camera 514 for capturing an image of the electronic device 100 as illuminated by the enveloping light source 512. The enveloping light source 512 may comprise a visible white light source and the full lighting camera 514 may be a camera operable to detect visible white light.

At the 90° position, the enveloping light source 512 is spaced at a certain distance away from and is positioned outside a perimeter of the electronic device 100 which is held by the pick head 410, and the area covered by the enveloping light source 512 is larger than an area of the electronic device 100 that is illuminated (see FIG. 9). Hence, the enveloping light source 512 illuminates a non-functional surface 104 of an electronic device 100 in the manner described above with reference to FIGS. 6 and 9. In other words, the enveloping light source 512 is sized and configured to illuminate a non-functional surface 104 of an electronic device 100 by projecting light from multiple directions. The full lighting camera 514 is positioned to receive the light from the enveloping light source 512 such that an obscured image 270 is first captured by the full lighting camera 514 which reveals the direction of the substantially parallel grinding marks 202 on the non-functional surface 104. The obscured image 270 is then sent to a processor (not shown) connected to the full lighting camera 514 to detect a grinding mark image portion 266 of the obscured image 270 (see FIG. 10). From the obscured image, the processor may ascertain the direction of the substantially parallel grinding marks 202 on the non-functional surface 104. Consequently, an angular arrangement of the adjustable lighting module 530 is determined in order to capture a clear image (see FIG. 8) of a laser marking 108 and an orientation mark 110 formed on the non-functional surface 104 of the electronic device 100.

The adjustable lighting module 530 comprises an adjustable light source 532 and an adjustable lighting camera 540. The adjustable light source 532 may comprise a ring structure such as a ring support structure 536 and an adjustment mechanism such as a motor 534 for moving or rotating the ring support structure 536. The ring support structure 536 may comprise a fixed light source, such as two LEDs 538, 542 mounted on opposite sides of a diameter of the ring support structure 536, similar to the adjustable light source 230 shown in FIGS. 6-7. It should be appreciated that the ring support structure 536 may also comprise one or more LEDs. Furthermore, the adjustable light source 532 is positioned outside a perimeter of the electronic device 100. Alternatively, the ring support structure 536 may comprise an independently movable cover with at least one opening, for example two openings, for selectively projecting light from a ring light source onto the electronic device 100. Such ring light source may comprise a fluorescent ring light source or a plurality of LEDs arranged in a circle. The ring support structure 536 is spaced at a certain distance away from the electronic device 100 which is held by the pick head 410, similar to the arrangement shown in FIG. 6. The adjustable light source 532 may comprise a blue light source and the adjustable lighting camera 540 may be a camera operable to detect blue light. The full lighting camera 514 and the adjustable lighting camera 540 may be comprised in an imaging module positioned to receive the light projected from both the enveloping light source 512 and the adjustable light source 532.

Based on the information regarding the direction of the substantially parallel grinding marks 202 as ascertained by the processor, the motor 534 rotates the ring support structure 536 to position the two diametrically opposite LEDs 538, 542 such that a line connecting the two LEDs 538, 542 is substantially perpendicular to the substantially parallel grinding marks 202. The ring support structure 536 may be positioned by rotating the ring support structure 536 about an axis perpendicular to the non-functional surface 104 of the electronic device 100. By positioning the LEDs 538, 542 in this manner, much of the incident light projected from the two LEDs 538, 542 is reflected by the grinding marks 202 and is received by the adjustable lighting camera 540. In other words, the adjustable light source 532 is positionable to project light onto the surface of the semiconductor device at an oblique angle relative to the non-functional surface 104 of the electronic device 100 in a projection direction which is substantially perpendicular to the direction of the grinding marks 202. The adjustable light source 532 may project light from opposite sides of the electronic device 100 in opposing projection directions which are substantially perpendicular to the direction of the grinding marks 202 on the electronic device 100. Thus, the adjustable lighting camera 540 captures a clear image 260 (see FIG. 8) which depicts a laser marking image portion 262, an orientation mark image portion 264 and a grinding mark image portion 266. This allows the laser marking 108 and the orientation mark 110 on the non-functional surface 104 of the electronic device 100 to be more distinguishable. Alternatively, a movable cover with at least one opening may be moved until the at least one opening is aligned with the projection direction, and the light is projected from the adjustable light source 532 through the at least one opening onto the electronic device 100 in the projection direction which is substantially perpendicular to the direction of the grinding marks 202.

Figure 13:
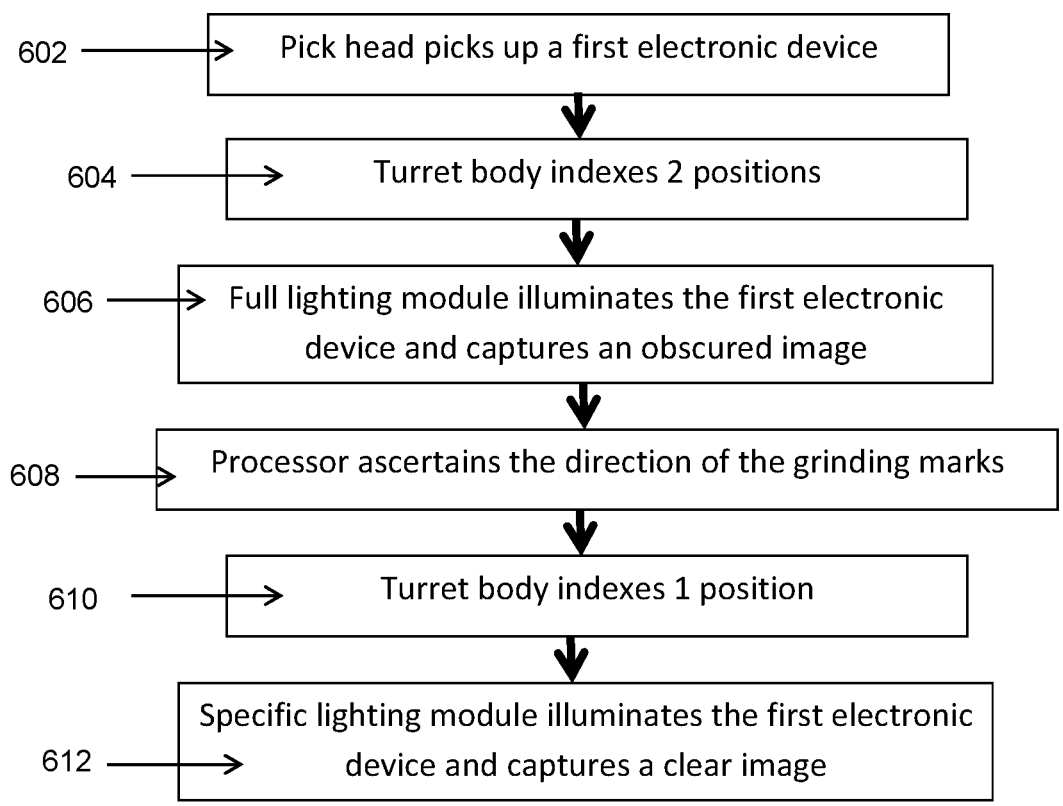
FIG. 13 is a flowchart showing the steps comprised in an inspection process for inspecting electronic devices using the inspection apparatus of FIGS. 11-12.

An inspection process for inspecting electronic devices 100 using the inspection apparatus 300 of FIGS. 11-12 will now be described, as illustrated in FIG. 13. The electronic devices 100 may comprise substantially transparent electronic devices.

A singulated wafer 200 is first provided on a holding area 250 of the inspection apparatus 300, such as an adhesive tape beneath a turret body 404. The wafer 200 comprises electronic devices 100 which are provided at the holding area 250 and are orientated such that the functional surfaces 102 of the electronic devices 100 face away from the adhesive tape. In other words, the non-functional surfaces 104 of the electronic devices 100 adhere to the adhesive tape.

In step 602, a first pick head 410 of a first holder 406 which is at the 180° position picks up a first electronic device 100 from the holding area 250. Then, in step 604, the turret body 404 indexes by two increments, such that the first electronic device 100 held by the first pick head 410 is at the 90° position. Thereafter, in step 606, the full lighting module 510 illuminates the non-functional surface 104 of the first electronic device 100 from multiple directions with an enveloping light source, and captures a first image or an obscured image 270 comprising a grinding mark image portion 266. In other words, the obscured image reveals a direction of the grinding marks 202 on the non-functional surface 104 of the first electronic device 100. In step 608, a processor ascertains the direction of the substantially parallel grinding marks 202 on the non-functional surface 104 from the grinding mark image portion 266 of the obscured image 270. Meanwhile, a second pick head and a third pick head 410 have respectively picked up a second electronic device and a third electronic device 100 respectively from the wafer 200.

Subsequently, in step 610, the turret body 404 indexes by one increment, to position the first electronic device at the 45° position. At the same time, the second electronic device 100 held by the second pick head 410 is also positioned at the 90° position, and steps 606 and 608 are repeated for the second electronic device 100. Next, in step 612, an adjustable lighting module 530 illuminates the non-functional surface 104 of the first electronic device 100 and captures a second image or a clear image 260 which depicts a laser marking image portion 262 and an orientation mark image portion 264. In order to illuminate the non-functional surface 104 of the first electronic device 100, the adjustable lighting module 530 is first relatively aligned with respect to the first electronic device 100, then the adjustable lighting module 530 projects light at an oblique angle relative to the non-functional surface 104 of the first electronic device 100 in a projection direction which is substantially perpendicular to the direction of the grinding marks. Hence, a laser marking 108 and an orientation mark 110 on the non-functional surface 104 of the first electronic device 100 can be accurately and clearly distinguishable. The above steps are repeated for the second, third and subsequent electronic devices 100.

It should be recognized that the specifics of the various processes recited above are provided for illustrative purposes only, and that other processes and materials which provide equivalent results may be substituted therefor.

Although the present invention has been described in considerable detail with reference to certain embodiments, other embodiments are possible.

For example, instead of locating the full lighting module 510 and the adjustable lighting module 530 at two different positions with respect to the circumference of the turret body 404, the lighting modules 510, 530 may both be located at a single position with respect to the circumference of the turret body 404. In this case, a single light source may be used in place of the separate full lighting module 510 and adjustable lighting module 530, and a single camera may be used instead of the full lighting camera 514 and the adjustable lighting camera 540. The single light source may be the enveloping light source 512 used together with a movable cover with two openings, or a plurality of LEDS arranged in a circle which are individually controllable to be turned on or off by the processor, so that the lighting angles are adjustable.

In addition, instead of rotating about a horizontal axis, the turret body 404 may rotate about an inclined axis. The turret body may also be operable to rotate either clockwise or anticlockwise.

Furthermore, instead of moving the ring structure, the adjustment mechanism may move the electronic device 100 in order to align the electronic device 100 and the adjustable light source 532.

Therefore, the spirit and scope of the appended claims should not be limited to the description of the embodiments contained herein.

The invention claimed is:

1. A method for inspecting a substantially transparent semiconductor device, the method comprising the steps of:
    holding the substantially transparent semiconductor device with a semiconductor device holder;
    illuminating a surface of the semiconductor device held by the semiconductor device holder from multiple directions with an enveloping light source;
    capturing a first image of the semiconductor device with an imaging module from the light projected from the enveloping light source, the first image revealing a direction of grinding marks on the said surface of the transparent semiconductor device;
    relatively aligning the semiconductor device and an adjustable light source based on the direction of the grinding marks; and
    projecting light from the adjustable light source onto the surface of the semiconductor device at an oblique angle relative to the surface of the semiconductor device in a projection direction from at least one side of the semiconductor device, such projection direction being substantially perpendicular to the direction of the grinding marks.

2. The method of claim 1, wherein the enveloping light source is positioned to encircle a perimeter of the semiconductor device.

3. The method of claim 1, wherein the adjustable light source is positioned outside a perimeter of the semiconductor device.

4. The method of claim 1, wherein the step of projecting light from the adjustable light source comprises the step of projecting light from opposite sides of the semiconductor device in opposing projection directions, the opposing projection directions both being substantially perpendicular to the direction of the grinding marks.

5. The method of claim 1, wherein the step of projecting light from the adjustable light source comprises the step of projecting light along planar directions which are substantially perpendicular to the direction of the grinding marks.

6. The method of claim 1, wherein after the step of capturing the first image, moving the semiconductor device from a location of the enveloping light source to a location of the adjustable light source for capturing a second image.

7. The method of claim 1, wherein the enveloping light source comprises a ring light source.

8. The method of claim 1, wherein the adjustable light source comprises at least one LED.

9. The method of claim 1, wherein the step of relatively aligning the semiconductor device and the adjustable light source based on the direction of the grinding marks comprises the step of moving a movable cover with at least one opening until the at least one opening is aligned with the projection direction, and light is projected from the adjustable light source through the at least one opening onto the semiconductor device in the projection direction which is substantially perpendicular to the direction of the grinding marks.

10. The method of claim 1, wherein the step of relatively aligning the semiconductor device and the adjustable light source further comprises the step of rotating a ring structure on which a fixed light source is mounted for positioning the fixed light source relative to the semiconductor device.

11. The method of claim 10, wherein the step of rotating the ring structure comprises the step of rotating the ring structure about an axis perpendicular to the said surface of the semiconductor device.

12. An apparatus for inspecting a substantially transparent semiconductor device, the apparatus comprising:
    a semiconductor device holder for holding the substantially transparent semiconductor device;
    an enveloping light source sized and configured to project light from multiple directions onto a surface of the semiconductor device;
    an imaging module positioned to receive the light projected from the enveloping light source to capture an image revealing a direction of grinding marks on the said surface of the semiconductor device;
    an adjustable light source positionable to project light onto the said surface of the semiconductor device at an oblique angle relative to the surface of the semiconductor device in a projection direction from at least one side of the semiconductor device, such projection direction being substantially perpendicular to the direction of the grinding marks; and
    an alignment mechanism operative to align the adjustable light source relative to the semiconductor device based on the direction of the grinding marks.

13. The apparatus of claim 12, wherein the enveloping light source is positioned to encircle a perimeter of the semiconductor device.

14. The apparatus of claim 12, wherein the adjustable light source is positioned outside a perimeter of the semiconductor device.

15. The apparatus of claim 12, wherein the adjustable light source is operative to project light from opposite sides of the semiconductor device in opposing projection directions, the opposing projection directions both being substantially perpendicular to the direction of the grinding marks.

* * * * *